United States Patent
Teramoto

(10) Patent No.: US 11,764,746 B2
(45) Date of Patent: Sep. 19, 2023

(54) STACKED COMPOSITE FILTER DEVICE

(71) Applicant: Murata Manufacturing Co., Ltd., Nagaokakyo (JP)

(72) Inventor: Masahiro Teramoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 173 days.

(21) Appl. No.: 17/098,674

(22) Filed: Nov. 16, 2020

(65) Prior Publication Data

US 2021/0067124 A1    Mar. 4, 2021

Related U.S. Application Data

(63) Continuation of application No. PCT/JP2019/017612, filed on Apr. 25, 2019.

(30) Foreign Application Priority Data

Jun. 22, 2018    (JP) .................................. 2018-119368
Nov. 6, 2018    (JP) .................................. 2018-209276

(51) Int. Cl.
  *H03H 7/01*    (2006.01)
  *H03H 7/075*    (2006.01)
  *H03H 1/00*    (2006.01)

(52) U.S. Cl.
  CPC .......... *H03H 7/0115* (2013.01); *H03H 7/075* (2013.01); *H03H 7/1758* (2013.01); *H03H 2001/0085* (2013.01)

(58) Field of Classification Search
  CPC ..................... H03H 2001/0085; H03H 7/0115

USPC .................................................. 333/175, 185
See application file for complete search history.

(56) References Cited

U.S. PATENT DOCUMENTS

| 2004/0046621 | A1* | 3/2004 | Furuya | H03H 7/1791 |
|              |     |        |        | 333/132 |
| 2006/0145782 | A1  | 7/2006 | Liu et al. | |
| 2015/0381134 | A1* | 12/2015 | Tanaka | H03H 7/0115 |
|              |     |        |        | 333/132 |
| 2017/0222616 | A1  | 8/2017 | Kitami et al. | |

(Continued)

FOREIGN PATENT DOCUMENTS

| JP | 2008-527808 A | 7/2008 |
| JP | 2017-135636 A | 8/2017 |

(Continued)

OTHER PUBLICATIONS

Official Communication issued in International Patent Application No. PCT/JP2019/017612, dated Jul. 9, 2019.

*Primary Examiner* — Rakesh B Patel
(74) *Attorney, Agent, or Firm* — KEATING & BENNETT, LLP

(57) ABSTRACT

A stacked composite filter device includes a stacked body having a first region and a second region that are different from each other. A first filter includes a first inductor and has a first pass band is arranged in the first region. A second filter includes a second inductor and has a second pass band on a lower frequency side than the first pass band is arranged in the second region. A first conductive structure extends in a stacking direction of the stacked body and includes one end grounded that is arranged in an area that is in the first region and adjacent to the second region. The other end of the first conductive structure is connected to the first inductor.

20 Claims, 9 Drawing Sheets

(56) References Cited

U.S. PATENT DOCUMENTS

2018/0006625 A1 1/2018 Kaminishi
2018/0269846 A1 9/2018 Mizoguchi

FOREIGN PATENT DOCUMENTS

WO 2016/152206 A1 9/2016
WO 2017/138405 A1 8/2017

* cited by examiner

ATTENUATION CHARACTERISTICS (S21) OF FIRST FILTER

ATTENUATION CHARACTERISTICS (S21) OF SECOND FILTER

ISOLATION CHARACTERISTICS (S12) FOR SIGNAL LEAKAGE FROM PASS BAND OF SECOND FILTER TO PASS BAND OF FIRST FILTER

STACKED COMPOSITE FILTER DEVICE

CROSS REFERENCE TO RELATED APPLICATIONS

This application claims the benefit of priority to Japanese Patent Application No. 2018-209276 filed on Nov. 6, 2018 and Japanese Patent Application No. 2018-119368 filed Jun. 22, 2018 and is a Continuation Application of PCT Application No. PCT/JP2019/017612 filed on Apr. 25, 2019. The entire contents of each application are hereby incorporated herein by reference.

BACKGROUND OF THE INVENTION

1. Field of the Invention

This present invention relates to a stacked composite filter device.

2. Description of the Related Art

In recent years, further miniaturization and space saving of small mobile communication devices have been in progress. Accordingly, there are needs to reduce the size of a branching filter used in a small mobile communication device. As the branching filter suitable for miniaturization, a stacked composite filter device is known that includes a plurality of filters including a plurality of stacked dielectric layers, a pattern conductor, and a via conductor. As an example of such a stacked composite filter device, there is a stacked composite filter device described in Japanese Patent Application Laid-Open No. 2017-135636.

The stacked composite filter device described in Japanese Patent Application Laid-Open No. 2017-135636 includes a common port, a first signal port, a second signal port, a first filter, and a second filter. The first filter is provided between the common port and the first signal port, and selectively passes signals having frequencies within a first pass band. The second filter is provided between the common port and the second signal port, and selectively passes signals having frequencies within a second pass band different from the first pass band.

In the stacked composite filter device described in Japanese Patent Application Laid-Open No. 2017-135636, an electromagnetic field coupling occurs between the first filter and the second filter, and a signal passing through one filter may leak to the other filter.

SUMMARY OF THE INVENTION

Preferred embodiments of the present invention provide stacked composite filter devices that are each able to significantly reduce or prevent signal leakage between a first filter and a second filter.

In the stacked composite filter devices according to the preferred embodiments of the present invention, structures that significantly reduce or prevent signal leakage between the first filter and the second filter are able to be significantly improved.

A stacked composite filter device according to a preferred embodiment of the present invention includes a stacked body. The stacked body has a first region and a second region that are different from each other. A first filter including a first inductor and having a first pass band is provided in the first region. A second filter including a second inductor and having a second pass band on a lower frequency side than the first pass band is provided in the second region.

A first conductive structure is provided in either an area that is in the first region and adjacent to the second region or an area that is in the second region and adjacent to the first region. The first conductive structure extends in a stacking direction of the stacked body and has one end grounded. When the first conductive structure is provided in the area that is in the first region and adjacent to the second region, the other end of the first conductive structure is connected to the first inductor. Further, when the first conductive structure is arranged in the area that is in the second region and adjacent to the first region, the other end of the first conductive structure is connected to the second inductor.

A stacked composite filter device according to a preferred embodiment of the present invention includes a stacked body provided by stacking a plurality of dielectric layers, first to third signal electrodes, and a grounding electrode. The stacked body includes at least one each of first and second inductor patterns and at least two each of first and second capacitor patterns, and at least one first conductive structure. The first and second inductor patterns and the first and second capacitor patterns are each provided between predetermined layers of the plurality of dielectric layers. The first conductive structure penetrates at least one of the dielectric layers.

A first filter including the first inductor pattern and the first capacitor patterns and having a first pass band is provided between the first electrode and the second electrode. A second filter including the second inductor pattern and the second capacitor patterns and having a second pass band on a lower frequency side than the first pass band is provided between the first electrode and the third electrode. The first filter and the second filter do not overlap with each other when the stacked body is viewed in a stacking direction of the plurality of dielectric layers.

The first conductive structure includes one end grounded and the other end connected to one of the first or second inductor pattern. The first conductive structure is provided between at least one of the first capacitor patterns and at least one of the second capacitor patterns.

A stacked composite filter device according to a preferred embodiment of the present invention is a stacked composite filter device defined by a stacked body in which a plurality of dielectric layers and a plurality of conductor layers are stacked. A first filter, a second filter, a grounding conductor, and a conductive structure are provided. The first filter includes a first inductor and a first capacitor.

The second filter includes a second inductor and a second capacitor. The grounding conductor is connected to a ground potential. The conductive structure extends in a stacking direction of the stacked body. The first filter and the second filter are provided in a first region and a second region different from each other, respectively, when viewed in plan view in the stacking direction. The conductive structure electrically connects the first inductor to the grounding conductor and is arranged adjacent to the second region.

According to the structure of the stacked composite filter devices according to preferred embodiments of the present invention, signal leakage between the first filter and the second filter is able to be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
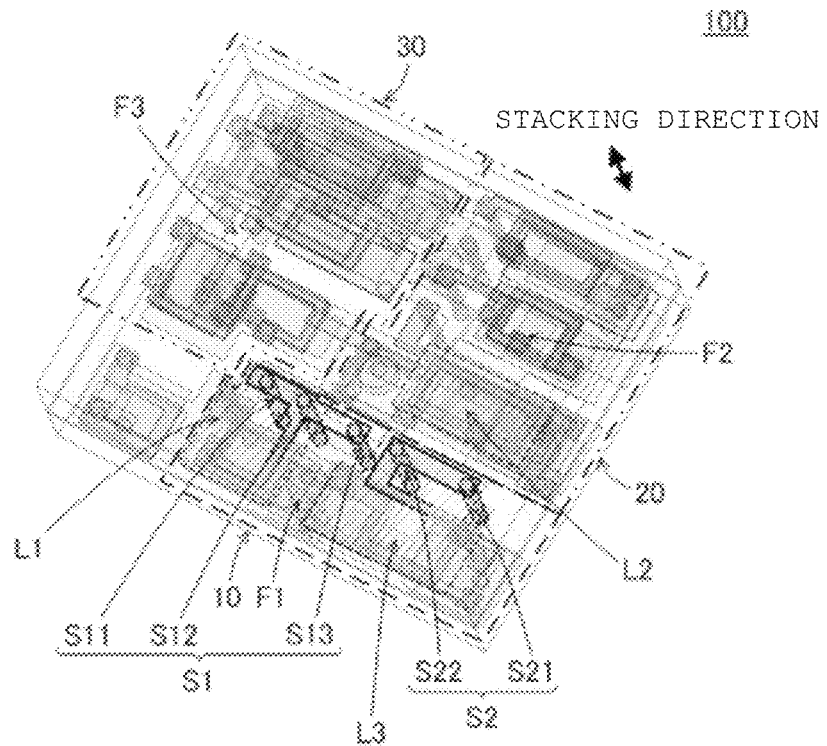
FIG. 1 is a transparent perspective view illustrating a first region, a second region, and a third region of a stacked body of a stacked composite filter device according to a first preferred embodiment of the present invention.

The features of the present invention will be described based on preferred embodiments of the present invention with reference to the drawings. In the preferred embodiments described below, the same or common elements and portions may be designated by the same reference numerals in the drawings, and the description thereof may not be repeated.

First Preferred Embodiment

A stacked composite filter device 100, which is a first preferred embodiment of present invention, will be described with reference to FIGS. 1 and 2.

The stacked composite filter device 100 includes a rectangular parallelepiped or substantially rectangular parallelepiped stacked body that is provided by stacking dielectric layers and includes a pattern conductor and a via conductor. A stacking direction of the dielectric layers is a direction orthogonal or substantially orthogonal to the pattern conductor and is represented by an arrow.

FIG. 1 is a transparent perspective view illustrating a first region 10, a second region 20, and a third region 30, which are different regions from each other, of the stacked body of the stacked composite filter device 100. A dashed line corresponding to the first region 10, an alternate long and short dash line corresponding to the second region 20, and an alternate long and two short dashes line corresponding to the third region 30 show that the respective regions are different regions from each other. In FIG. 1, the pattern conductor and the via conductor can be viewed through a dielectric layer.

In the first region 10, a first filter F1 having a first pass band is provided. The first filter F1 includes a first inductor L1 and a third inductor L3. The first inductor L1 and the third inductor L3 are provided in a hatched region of the first region 10.

In the second region 20, a second filter F2 having a second pass band located on a lower frequency side than the first pass band is provided. The second filter F2 includes a second inductor L2. The second inductor L2 is provided in a hatched region of the second region 20.

Figure 6A:
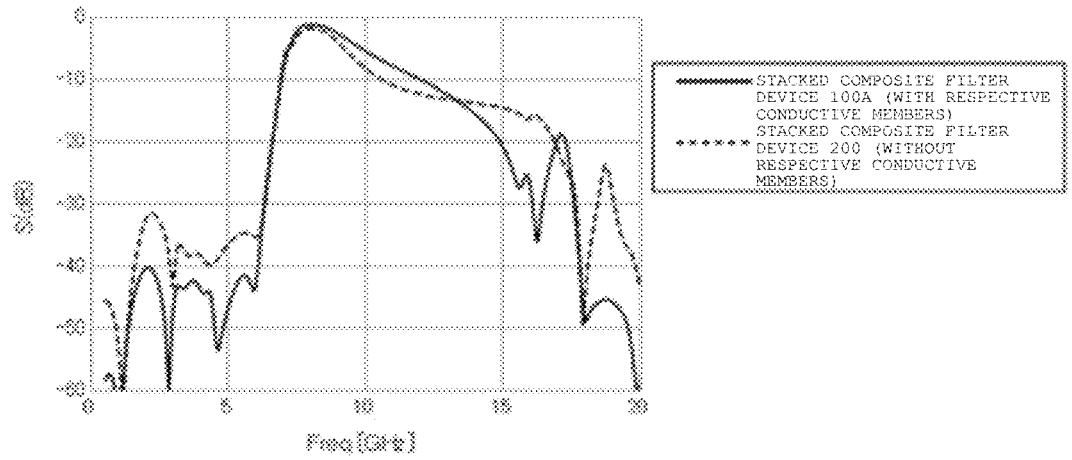
FIGS. 6A to 6C are graphs illustrating filter characteristics (attenuation characteristics and isolation characteristics) of the filters in the stacked composite filter device and the stacked composite filter device.
Figure 6B:
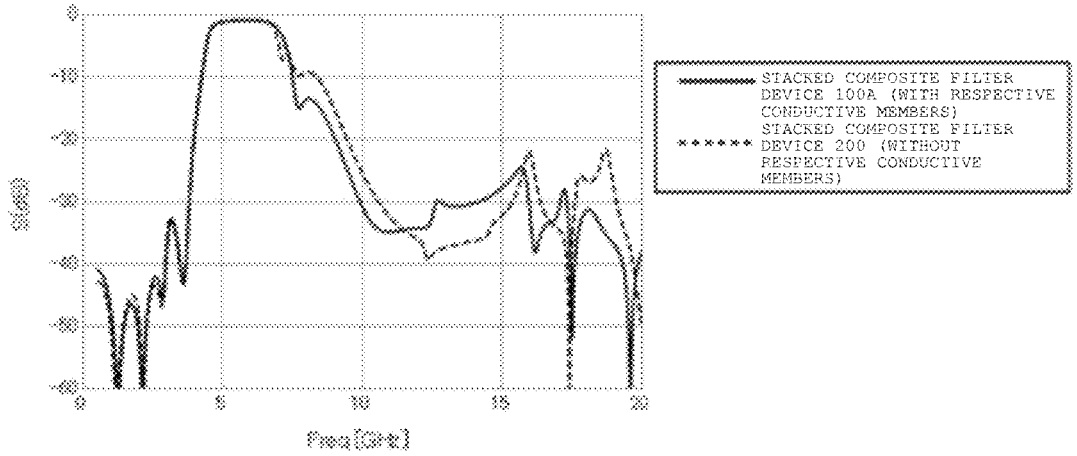
Figure 6C:
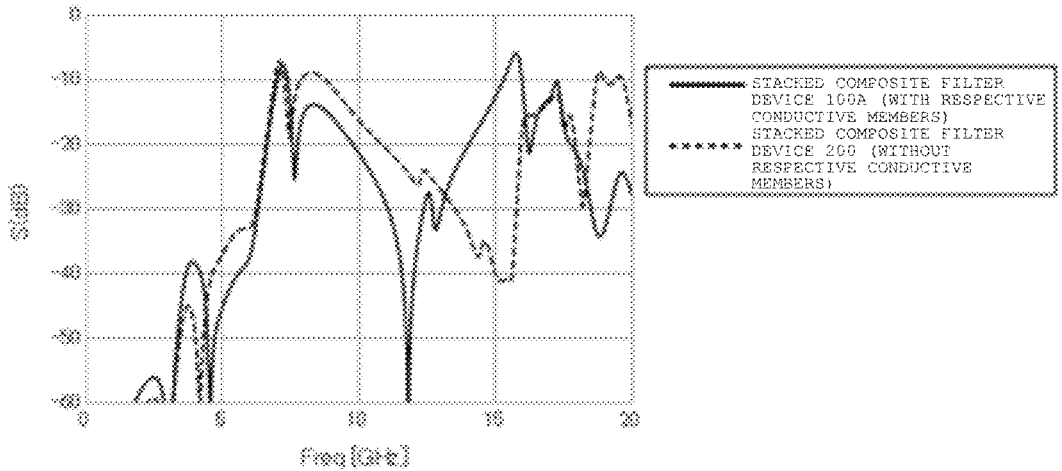

Here, the portion that the second pass band is on the lower frequency side than the first pass band means that a lower limit value of the second pass band is on the lower frequency side than a lower limit value of the first pass band, and an upper limit value of the second pass band is on the lower frequency side than an upper limit value of the first pass band. The lower limit value of the pass band refers to a frequency on the lowest frequency side among frequencies that are about 3 dB smaller than a maximum value (about 0 dB) of signal level in frequency characteristics of S21 (attenuation characteristic) as illustrated in FIGS. 6A to 6C. Further, the upper limit value of the pass band refers to a frequency on the highest frequency side among frequencies that are about 3 dB smaller than the maximum value (about 0 dB) of the signal level in the frequency characteristics of S21 as illustrated in FIGS. 6A to 6C.

In the third region 30, a third filter F3 having a third pass band located on the lower frequency side than the second pass band is provided. A lower limit value of the third pass band is on a lower frequency side than the lower limit value of the second pass band, and an upper limit value of the third pass band is on a lower frequency side than the upper limit value of the second pass band. The upper limit value and the lower limit value are similar to those above.

That is, the stacked composite filter device 100 is a triplexer that has three pass bands and separates three signals having different frequency bands from each other. However, as will be described later, the preferred embodiments of the present invention are able to be applied not only to a triplexer, but also to a multiplexer including a diplexer, a quadplexer, and the like, and other stacked composite filter devices.

A first conductive structure S1 and a second conductive structure S2 are provided in an area that is in the first region 10 and adjacent to the second region 20.

In the stacked composite filter device 100, the first conductive structure S1 is defined by three via conductors S11, S12, S13. The three via conductors S11, S12, S13 each extend in the stacking direction of the stacked body, and have one end grounded. Further, the second conductive structure S2 is defined by two via conductors S21, S22. The two via conductors S21, S22 also each extend in the stacking direction of the stacked body, and have one end grounded.

The respective other ends of the three via conductors S11, S12, S13 defining the first conductive structure S1 are connected to the first inductor L1. Further, the respective other ends of the two via conductors S21, S22 defining the second conductive structure S2 are connected to the third inductor L3.

The above features provide a larger grounding area than if only the first conductive structure S1 is grounded, and thus shielding against a signal leaking from the second filter is able to be significantly improved.

The features of the first conductive structure S1 and the second conductive structure S2 are not limited to the above features. Further, as will be described later, the first conductive structure S1 and the second conductive structure S2 define both a grounding conductor when grounding the first filter F1 and a shield conductor between the first filter F1 and the second filter F2. Depending on the structure of the first filter F1, grounding may be performed only by the first conductive structure S1. That is, the second conductive structure S2 is not a necessary component.

Figure 2:
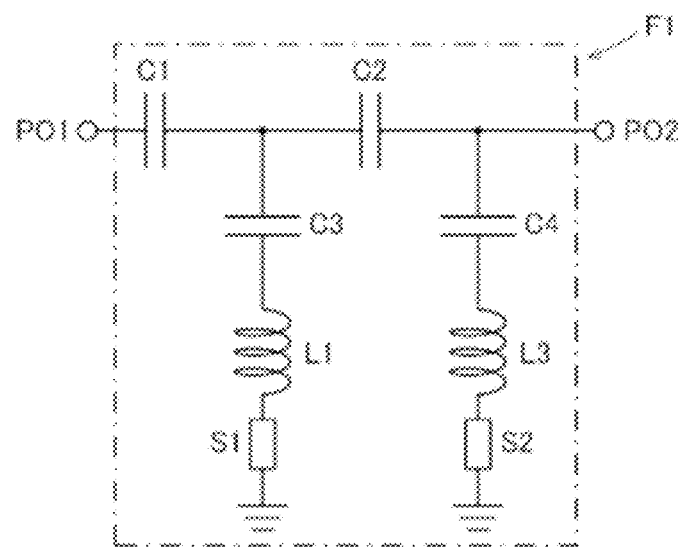
FIG. 2 is an equivalent circuit diagram of a first filter arranged in the first region in the stacked composite filter device.

FIG. 2 is an equivalent circuit diagram of the first filter F1 provided in the first region 10 and having the first pass band in the stacked composite filter device 100. Equivalent circuit diagrams of the second filter F2 and the third filter F3 are omitted. In the first filter F1, a first capacitor C1 and a second capacitor C2 are connected in series between a first signal port PO1 and a second signal port PO2.

A third capacitor C3, the first inductor L1, and the first conductive structure S1 are connected in series between a node between the first capacitor C1 and the second capacitor C2 and the ground. As described above, the first conductive structure S1 has one end grounded and the other end connected to the first inductor L1.

Similarly, a fourth capacitor C4, the third inductor L3, and the second conductive structure S2 are connected in series between a node between the second capacitor C2 and the second signal port PO2 and the ground. As described above, the second conductive structure S2 has one end grounded and the other end connected to the third inductor L3.

In the stacked composite filter device 100, even if a signal passing through the second pass band leaks to the first filter F1 side, the signal is dropped to the ground through the first conductive structure S1 and the second conductive structure S2 that have one end grounded. That is, the first conductive structure S1 and the second conductive structure S2 are shield structures that significantly reduce or prevent signal leakage from the second pass band to the first pass band.

The first conductive structure S1 may be provided in an area that is in the second region 20 and adjacent to the first region 10. The first conductive structure S1 has one end grounded as described above, and the other end not connected to the first inductor but connected to the second inductor L2. Further, when the first filter F1 has the third inductor L3, the second conductive structure S2 may be further arranged in the area that is in the second region 20 and adjacent to the first region 10.

The second conductive structure S2 has one end grounded as described above, and the other end not connected to the third inductor but instead connected to the second inductor L2.

In this case, in the stacked composite filter device 100, even if a signal passing through the first pass band leaks to the second filter F2 side, the signal is dropped to the ground through the first conductive structure S1 and the second conductive structure S2 that have one end grounded.

That is, the first conductive structure S1 and the second conductive structure S2 are shield structures that significantly reduce or prevent signal leakage from the first pass band to the second pass band.

Therefore, the stacked composite filter device 100 is able to significantly reduce or prevent signal leakage between the first filter F1 and the second filter F2.

In the stacked composite filter, harmonics of the signal passing through the low frequency side pass band tend to leak to the high frequency side pass band and affect an attenuation characteristic and an isolation characteristic. That is, in order to provide favorable filter characteristics, signal leakage from the low frequency side pass band to the high frequency side pass band is significantly reduced or prevented. Therefore, it is preferable that the first conductive structure S1 and the second conductive structure S2 are arranged in an area that is in the first region 10 and adjacent to the second region 20.

Second Preferred Embodiment

A stacked composite filter device 100A, which is a second preferred embodiment of the present invention, will be described with reference to FIGS. 3 and 4.

Figure 3:
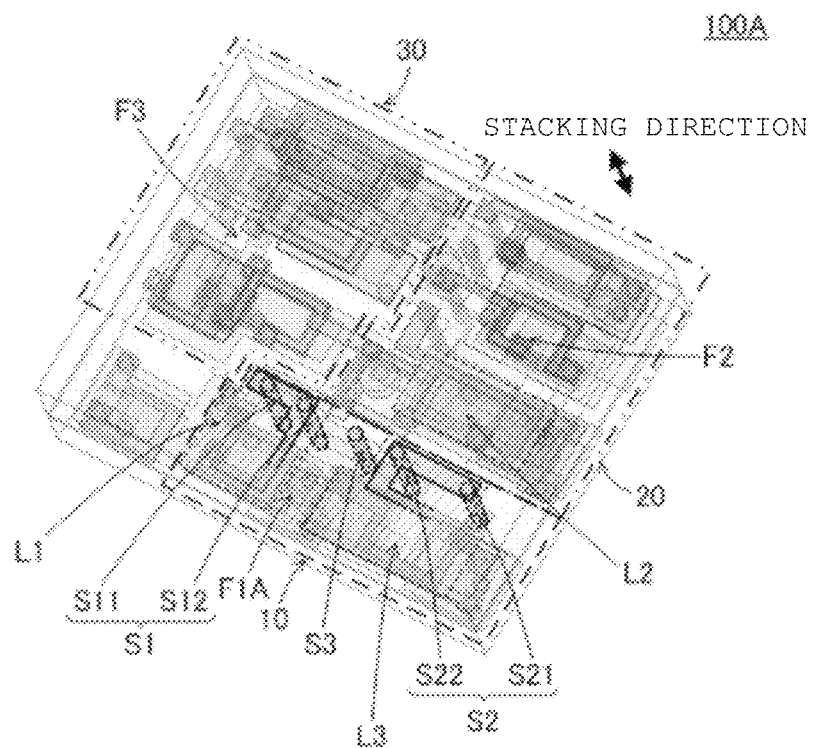
FIG. 3 is a transparent perspective view illustrating a first region, a second region, and a third region of a stacked body of a stacked composite filter device according to a second preferred embodiment of the present invention.

FIG. 3 is a transparent perspective view illustrating a first region 10, a second region 20, and a third region 30, which are different regions from each other, of the stacked body of the stacked composite filter device 100A. A dashed line corresponding to the first region 10, an alternate long and short dash line corresponding to the second region 20, and an alternate long and two short dashes line corresponding to the third region 30 show that the respective regions are different regions as in FIG. 1.

In the first region 10 of the stacked body of the stacked composite filter device 100A, a first filter F1A having a first pass band is provided in place of the first filter F1 of the stacked composite filter device 100. In the second region 20, a second filter F2 having a second pass band located on a lower frequency side than the first pass band is provided. In the third region 30, a third filter F3 having a third pass band located on the lower frequency side than the second pass band is provided.

In the first region 10, the first filter F1 having the first pass band is provided. The first filter F1 includes a first inductor L1 and a third inductor L3. The first inductor L1 and the third inductor L3 are provided in a hatched region of the first region 10. A first conductive structure S1, a second conductive structure S2, and a third conductive structure S3 are provided in an area that is in the first region 10 and adjacent to the second region 20. The third conductive structure S3 is provided between the first conductive structure S1 and the second conductive structure S2.

In the stacked composite filter device 100A, the first conductive structure S1 is defined by two via conductors S11, S12. The two via conductors S11, S12 each extend in the stacking direction of the stacked body, and have one end grounded. Further, the second conductive structure S2 is defined by two via conductors S21, S22. The two via conductors S21, S22 also each extend in the stacking direction of the stacked body, and have one end grounded. The third conductive structure S3 is defined by one via conductor. The third conductive structure S3 also extends in the stacking direction of the stacked body, and has one end grounded.

The features of the first conductive structure S1, the second conductive structure S2, and the third conductive structure S3 are not limited to the above.

The respective other ends of S11, S12 of the three via conductors defining the first conductive structure S1 are connected to the first inductor L1. The respective other ends of S21, S22 of the two via conductors defining the second conductive structure S2 are connected to the third inductor L3. On the other hand, the other end of the third conductive structure S3 is in an open state. The open state means a state that the device is not electrically connected to anything and is floating.

Figure 4:
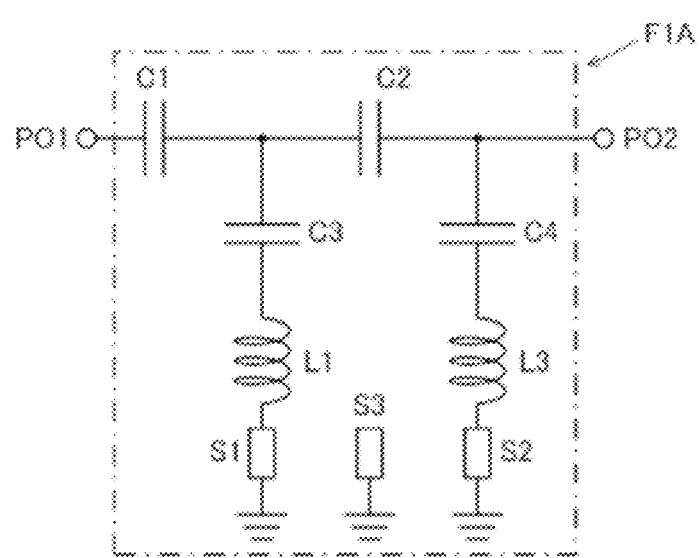
FIG. 4 is an equivalent circuit diagram of a first filter provided in the first region in the stacked composite filter device.

FIG. 4 is an equivalent circuit diagram of the first filter F1A provided in the first region 10 in the stacked composite filter device 100A. Equivalent circuit diagrams of the second filter F2 and the third filter F3 are omitted. The equivalent circuit diagram of FIG. 4 illustrates that the third conductive structure S3 having one end grounded and the other end not connected to another circuit element and in an open state is provided between the first conductive structure S1 and the second conductive structure S2 in the first filter F1A. Other features are the same as or similar to the features of the equivalent circuit diagram of FIG. 2, and thus the description thereof will be omitted.

In the stacked composite filter device 100A, the first conductive structure S1 and the second conductive structure S2 are shield structures that significantly reduce or prevent signal leakage from the second pass band to the first pass band, similarly to the stacked composite filter device 100.

Further, the third conductive structure S3 provided in the stacked composite filter device 100A significantly reduces or prevents electromagnetic field coupling between the via conductor S12 of the first conductive structure S1 and the via conductor S22 of the second conductive structure S2. Thus, electromagnetic field coupling between the first inductor L1 and the third inductor L3 is significantly reduced or prevented. Accordingly, impedance of the first inductor L1 and the third inductor L3 is able to be significantly reduced or prevented, and significantly improved filter characteristics are able to be provided.

An example in which filter characteristics of the stacked composite filter device 100A, which is the second preferred embodiment of the present invention, are compared with the filter characteristics in a case where each of the conductive structures described above is not provided will be described with reference to FIGS. 5 and 6.

Figure 5:
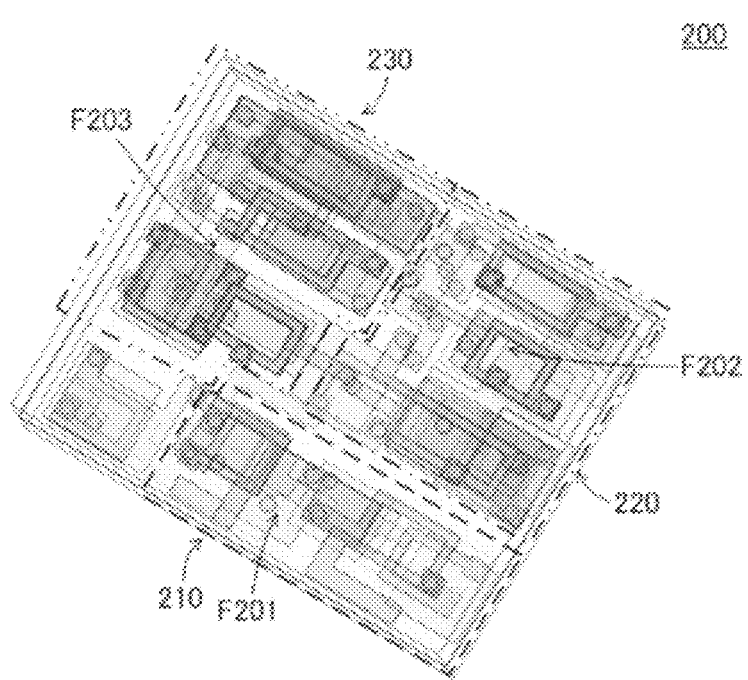
FIG. 5 is a transparent perspective view illustrating a first region, a second region, and a third region of a stacked body of a comparative example of a stacked composite filter device.

FIG. 5 is a transparent perspective view illustrating a first region 210, a second region 220, and a third region 230, which are different regions from each other, of the stacked body of a stacked composite filter device 200, which is a comparative example with respect to the stacked composite filter device 100A. A dashed line corresponding to the first region 210, an alternate long and short dash line corresponding to the second region 220, and an alternate long and two short dashes line corresponding to the third region 230 show that the respective regions are different regions as in FIG. 1.

A first filter F201 having a first pass band is provided in the first region 210 of the stacked body of the stacked composite filter device 200. In the second region 220, a second filter F202 having a second pass band located on the lower frequency side than the first pass band is provided. In the third region 230, a third filter F203 having a third pass band located on the even lower frequency side than the second pass band is provided.

In the first filter F201, nothing equivalent to each conductive structure of the first filter F1A is provided in an area that is in the first region 210 and adjacent to the second region 220 and an area that is in the second region 220 and adjacent to the first region 210. Other features are the same as or similar to the features of the stacked composite filter device 100A, and thus the description thereof will be omitted.

FIGS. 6A to 6C are graphs representing filter characteristics (attenuation characteristics and isolation characteristics) of the filters in the stacked composite filter device 100A and the stacked composite filter device 200. The filter characteristics of the filters are provided by simulations in which capacitance of each capacitor and inductance of each inductor are set to predetermined values.

FIG. 6A is a graph representing the attenuation characteristics (S21) of the first filter of each of the stacked composite filter devices. Looking at this result, the first filter F1A attenuates more than the first filter F201 of the comparative example on the low frequency side of the pass band.

FIG. 6B is a graph representing the attenuation characteristics (S21) of the second filter of each of the stacked composite filter devices. The second pass band of the second filter in each of the stacked composite filter devices is on the lower frequency side than the first pass band of the first filter described above. Looking at this result, the second filter F2 attenuates more than the second filter F202 in the comparative example on the high frequency side of the pass band.

That is, signal leakage between the first filter and the second filter is significantly reduced or prevented in the stacked composite filter device 100A in which the above-described conductive structures are provided on an edge portion of the first region 10 opposing an edge portion of the second region 20.

FIG. 6C is a graph representing the isolation characteristics (S21) of each of the stacked composite filter devices for signal leakage from the pass band of the second filter to the pass band of the first filter. As shown in FIG. 6C, in the stacked composite filter device 100A, high isolation is provided as compared with the stacked composite filter device 200 in the attenuation region of the second filter F2 (for example, between approximately 7.5 GHz and approximately 12 GHz, see FIG. 6B).

That is, in the stacked composite filter device 100A, because the signal leakage between the first filter and the second filter is significantly reduced or prevented, high isolation is provided between the first filter and the second filter.

Third Preferred Embodiment

A stacked composite filter device 100B, which is a third preferred embodiment of the present invention, will be described with reference to FIGS. 7 to 9.

Figure 7:
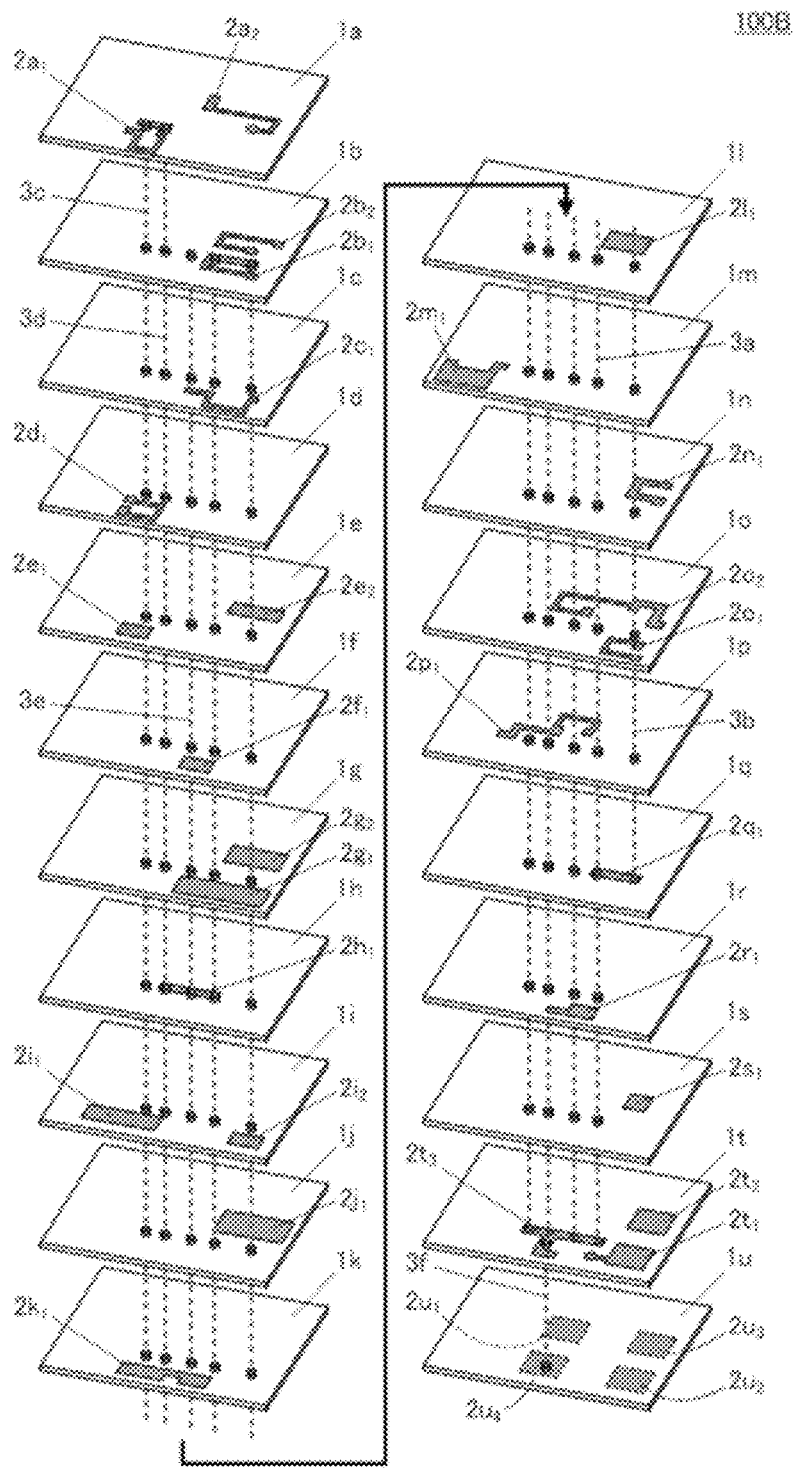
FIG. 7 is an exploded perspective view of a stacked composite filter device according to a third preferred embodiment of the present invention.

FIG. 7 is an exploded perspective view of the stacked composite filter device 100B. FIG. 8 is an equivalent circuit diagram of a first filter F1B and a second filter F2B included in the stacked composite filter device 100B.

FIG. 7 illustrates only components necessary for the following description, and other components such as a pattern conductor and a via conductor are not illustrated. Therefore, in an equivalent circuit diagram illustrated in FIG. 8, there are components thereof that are not illustrated in FIG. 7. Further, FIG. 7 is a schematic view, and for example, a thickness of a dielectric layer and each pattern conductor described later, a thickness of a via conductor, and the like are schematic. Further, variations in shapes of components that occur in the manufacturing process and the like are not necessarily reflected in each drawing. That is, it can be said that the drawings used for explanation in the present description represent an actual product in an essential aspect even if there are some parts different from the actual product.

The stacked composite filter device 100B includes a stacked body in which dielectric layers 1a to 1u (a plurality of dielectric layers) are stacked, a first signal electrode $2u_1$, a second signal electrode $2u_2$, a third signal electrode $2u_3$, and a grounding electrode $2u_4$. The "grounding conductor" in the third preferred embodiment may include the grounding electrode $2u_4$.

The stacked body includes a first inductor pattern, a second inductor pattern, a first capacitor pattern, a second capacitor pattern, first to third conductive structures, and a connecting structure.

The first inductor pattern is a pattern conductor included in a plurality of inductors defining the first filter F1B, and includes pattern conductors $2a_1$, $2b_1$.

Figure 8:
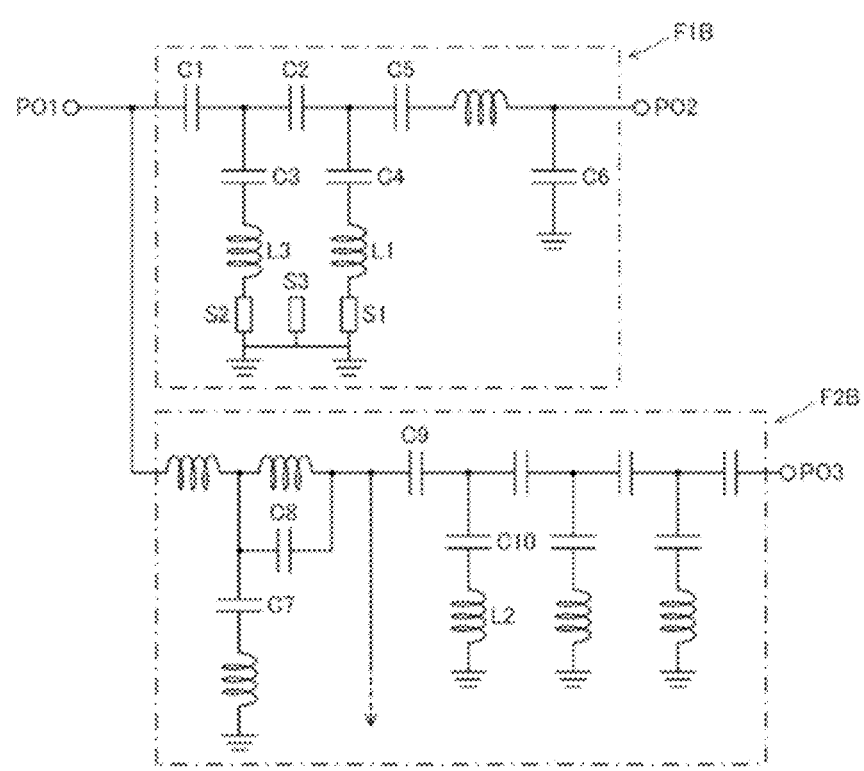
FIG. 8 is an equivalent circuit diagram of a first filter and a second filter included in the stacked composite filter device.

The pattern conductor $2a_1$ is included in the inductor L3 of the equivalent circuit in FIG. 8, and the pattern conductor $2b_1$ is included in the inductor L1 of the equivalent circuit in FIG. 8. The first capacitor pattern (first capacitor) is a pattern conductor included in a plurality of capacitors defining the first filter F1B, and includes pattern conductors $2e_1$, $2f_1$, $2g_1$, $2i_1$, $2i_2$, $2k_1$, $2m_1$, $2r_1$, $2t_1$. The "first inductor" in the third preferred embodiment may include inductors L1 and L3.

The pattern conductor $2e_1$ is included in the capacitor C3 of the equivalent circuit in FIG. 8, the pattern conductor $2f_1$ is included in the capacitor C4 of the equivalent circuit in FIG. 8, the pattern conductor $2g_1$ is included in the capacitors C2, C4, and C5 of the equivalent circuit in FIG. 8, the pattern conductor $2i_1$ is included in the capacitors C1, C2, and C3 of the equivalent circuit in FIG. 8, the pattern conductor $2i_2$ is included in C5 as the capacitor of the equivalent circuit in FIG. 8, the pattern conductor $2k_1$ is included in the capacitor C2 of the equivalent circuit in FIG. 8, the pattern conductor $2m_1$ is included in the capacitor C1 of the equivalent circuit in FIG. 8, the pattern conductor $2r_1$ is included in a capacitor C6 of the equivalent circuit in FIG. 8, and the pattern conductor $2t_1$ is included in the capacitor C6 of the equivalent circuit in FIG. 8.

The second inductor pattern is a pattern conductor included in a plurality of inductors defining the second filter F2B, and includes $2a_2$, $2o_2$. The pattern conductor $2a_2$ is included in the inductor L2 of the equivalent circuit in FIG. 8, and the pattern conductor 202 is included in an inductor connected in parallel with a capacitor C8 of the equivalent circuit in FIG. 8. A via electrode on which the pattern conductor 202 is installed is not illustrated. The second capacitor pattern (second capacitor) is a pattern conductor included in a plurality of inductors defining the second filter F2B, and the second capacitor pattern includes pattern conductors $2e_2$, $2g_2$, $2j_1$, $2l_1$, $2s_1$, $2t_2$. The "second inductor" in the third preferred embodiment may include the inductor L2.

The pattern conductor $2e_2$ is included in a capacitor C10 of the equivalent circuit in FIG. 8, the pattern conductor $2g_2$ is included in capacitors C9 and C10 of the equivalent circuit in FIG. 8, the pattern conductor $2j_1$ is included in the capacitors C8 and C9 of the equivalent circuit in FIG. 8, the pattern conductor 211 is included in the capacitor C8 of the equivalent circuit in FIG. 8, the pattern conductor $2s_1$ is included in a capacitor C7 of the equivalent circuit in FIG. 8, and the pattern conductor $2t_2$ is included in the capacitor C7 of the equivalent circuit in FIG. 8.

The "plurality of conductor layers" in the third preferred embodiment may include pattern conductors $2a_1$ to $2t_1$, $2a_2$ to $2t_2$, signal electrodes $2u_1$ to $2u_3$, and grounding electrodes $2u_4$.

The first conductive structure S1 includes via conductors 3a, 3b. The second conductive structure S2 includes via conductors 3c, 3d. The third conductive structure S3 includes a via conductor 3e. The connecting structure includes the pattern conductor $2t_1$ and a via conductor 3f, and connects the first conductive structure S1, the second conductive structure S2, the third conductive structure S3, and the grounding electrode $2u_4$. The "conductive structure" in the third preferred embodiment may include the via conductors 3a to 3d. Further, the "second via conductor" in the third preferred embodiment may include the via conductor 3e.

The first and second inductor patterns and the capacitor patterns defining the first and second capacitor patterns are provided between predetermined layers of the plurality of dielectric layers. Each via conductor defining the first to third conductive structures is penetrates at least one of the dielectric layers.

Between the first signal electrode $2u_1$ and the second signal electrode $2u_2$, the first filter F1B is provided, which includes the first inductor pattern and the first capacitor pattern described above and has the first pass band. The first signal electrode $2u_1$ is an antenna connection electrode and corresponds to the first signal port PO1 in the equivalent circuit diagram. The second signal electrode $2u_2$ is an input-output electrode in the first pass band (high frequency side) and corresponds to the second signal port PO2 in the equivalent circuit diagram. The first filter F1B includes the first capacitor C1 to the sixth capacitor C6, the first inductor L1 and the third inductor L3, and the first conductive structure S1 to the third conductive structure S3.

The first capacitor C1 is defined by the pattern conductor $2i_1$ and the pattern conductor $2m_1$. The second capacitor C2 is defined by the pattern conductor $2g_1$, the pattern conductor $2i_1$, and the pattern conductor $2k_1$. The third capacitor C3 is defined by the pattern conductor $2e_1$ and the pattern conductor $2i_1$. The fourth capacitor C4 is defined by the pattern conductor $2f_1$ and the pattern conductor $2g_1$. The fifth capacitor C5 is defined by the pattern conductor $2g_1$ and the pattern conductor $2i_2$. The sixth capacitor C6 is defined by the pattern conductor $2r_1$ and the pattern conductor $2t_1$.

That is, the pattern conductor $2i_1$ is shared by the first capacitor C1 to the third capacitor C3. Further, the pattern conductor $2g_1$ is shared by the second capacitor C2, the fourth capacitor C4, and the fifth capacitor C5. Accordingly, the number of points of the pattern conductors is able to be significantly reduced, the stacked composite filter device is able to further be simplified in structure, and the stacked composite filter device is able to be significantly reduced in size.

The "first capacitor" in the third preferred embodiment may include the capacitors C1 to C5.

The first inductor L1 is included in the pattern conductor $2b_1$. The third inductor L3 is included in the pattern conductor $2a_1$. The description of features of the other inductors that are not illustrated will be omitted. The first inductor L1 is connected to the grounding electrode $2u_4$ with the first conductive structure S1 described later interposed therebetween. The third inductor L3 is connected to the grounding electrode $2u_4$ with the second conductive structure S2 described later interposed therebetween.

Between the first signal electrode $2u_1$ and the third signal electrode $2u_3$, the second filter F2B is provided, which includes the second inductor pattern and the second capacitor pattern described above, and has the second pass band located on the lower frequency side than the first pass band. The third signal electrode $2u_3$ is an input-output electrode in the second pass band (low frequency side) and corresponds to a third signal port PO3 in the equivalent circuit diagram. The second filter F2B includes the seventh capacitor C7 to the tenth capacitor C10 and the second inductor L2.

The seventh capacitor C7 is defined by the pattern conductor $2s_1$ and the pattern conductor $2t_2$. The eighth capacitor C8 is defined by the pattern conductor $2j_1$ and the pattern conductor 2l1. The ninth capacitor C9 is defined by the pattern conductor $2g_2$ and the pattern conductor $2j_1$. The tenth capacitor C10 is defined by the pattern conductor $2e_2$ and the pattern conductor $2g_2$.

That is, the pattern conductor $2j_1$ is shared by the eighth capacitor C8 and the ninth capacitor C9. Further, the pattern conductor $2g_2$ is shared by the ninth capacitor C9 and the tenth capacitor C10. Accordingly, the number of points of the pattern conductors is able to be significantly reduced, the stacked composite filter device is able to be further simplified, and the stacked composite filter device is able to be significantly reduced in size.

The "second capacitor" in the third preferred embodiment may include the capacitors C7 to C10.

The second inductor L2 includes a pattern conductor $2a_2$ and is connected to the grounding electrode $2u_4$ by a via electrode that is not illustrated. The pattern conductors $2a_1$ and $2a_2$ are formed on the dielectric layer 1a farthest from the grounding electrode $2u_4$.

When the stacked body is viewed in the stacking direction of the dielectric layers 1a to 1u, the first filter F1B and the second filter F2B do not overlap with each other (see FIG. 3).

As described above, the first conductive structure S1 includes the via conductors 3a, 3b. The second conductive structure S2 includes the via conductors 3c, 3d. The via conductor 3b is connected to the via conductor 3a with a pattern conductor $2q_1$ interposed therebetween. The third conductive structure S3 includes the via conductor 3e. One end of each of the via conductors 3a, 3c to 3e is connected to the pattern conductor $2t_3$, and is grounded with the via conductor 3f and the grounding electrode $2u_4$ interposed therebetween.

The first filter F1B is grounded with the first conductive structure S1 and the second conductive structure S2 interposed therebetween. The above features provide a larger grounding area than if only the first conductive structure S1 is grounded, and thus the feature of shielding against a signal leaking from the second filter is able to be significantly improved. The first filter F1B does not have to include the second conductive structure S2.

The other ends of the via conductors 3a, 3b are connected to the pattern conductors $2b_1$ defining the first inductor pattern. Further, the other ends of the via conductors 3c, 3d are connected to the pattern conductor $2a_1$ which similarly defines the first inductor pattern. The other end of the via conductor 3e is in an open state in the stacked composite filter device 100B. The open state means a state that the device is not electrically connected to anything and is floating. Accordingly, the via conductor 3e is what is called an open stub. The via conductors 3a, 3b significantly reduce or prevent electromagnetic field coupling between the via conductors 3a, 3b of the first conductive structure S1 and the via conductors 3c, 3d of the second conductive structure S2. Thus, the electromagnetic field coupling between the first inductor L1 and the third inductor L3 is significantly reduced or prevented. Accordingly, impedance of the first inductor L1 and the third inductor L3 is able to be significantly reduced or prevented, and significantly improved filter characteristics are able to be provided.

The first conductive structure S1 and the second conductive structure S2 may each be connected to the pattern conductors defining the second inductor pattern.

The first filter F1B does not have to include the third conductive structure S3.

Figure 9A:
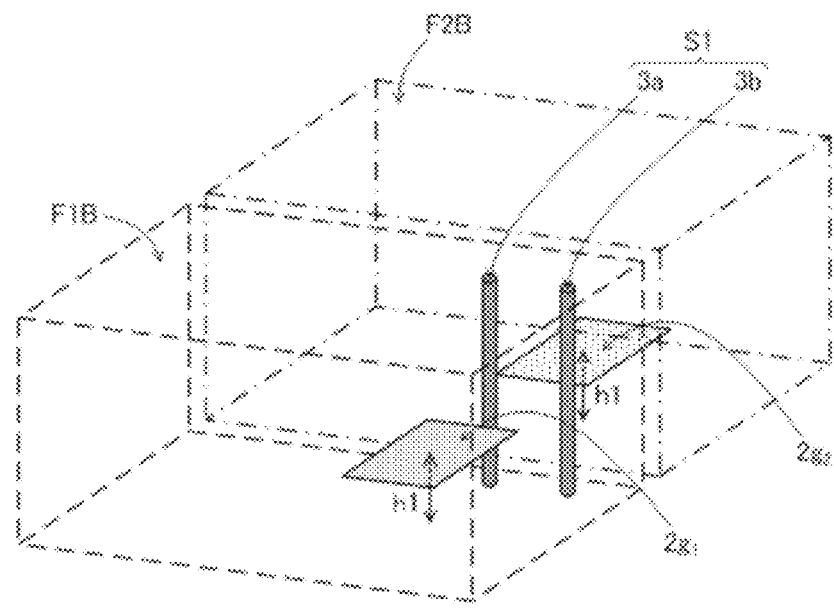
FIG. 9A is a transparent perspective view illustrating a positional relationship among a pattern conductor defining a first capacitor pattern, a pattern conductor defining a second capacitor pattern, and a first conductive structure.
Figure 9B:
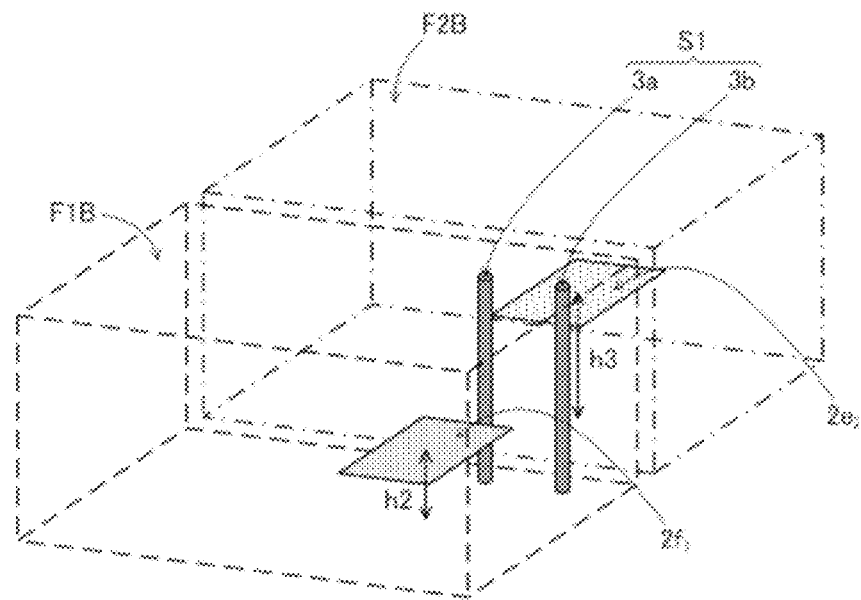
FIG. 9B is a transparent perspective view illustrating a positional relationship among the pattern conductor defining the first capacitor pattern, the pattern conductor defining the second capacitor pattern, and the first conductive structure.

FIGS. 9A and 9B are transparent perspective views illustrating an example of the positional relationship between the pattern conductor defining the first capacitor pattern, the pattern conductor defining the second capacitor pattern, and the first conductive structure S1. As illustrated in FIGS. 9A and 9B, the first conductive structure S1 is arranged between at least one of the first capacitor patterns and at least one of the second capacitor patterns.

In the stacked composite filter device 100B, even if a signal passing through the first pass band leaks to the second filter F2B side, it is dropped to the ground through the first conductive structure S1 that have one end grounded. That is, the first conductive structure S1 is a shield structure that significantly reduces or prevents signal leakage from the first pass band to the second pass band. The other end of the first conductive structure S1 is connected to a pattern conductor that is not illustrated, and thus the leaked signal can be more effectively dropped to the ground.

Therefore, the stacked composite filter device 100B is able to significantly reduce or prevent signal leakage between the first filter F1 and the second filter F2.

For the second conductive structure S2 that is not illustrated, the same can be said as the first conductive structure S1. The electromagnetic field coupling between the via conductor 3a of the first conductive structure S1 and the via conductor 3d of the second conductive structure S2 is significantly reduced or prevented by the third conductive structure S3 that is not illustrated. Therefore, the electromagnetic field coupling between the first inductor L1 and the third inductor L3 is significantly reduced or prevented (see FIG. 8). Accordingly, impedance of the first inductor L1 and the third inductor L3 does not increase, and significantly improved filter characteristics are able to be provided.

When the stacked body is viewed in a direction orthogonal or substantially orthogonal to the stacking direction of each dielectric layer, the first capacitor pattern and the second capacitor pattern with the first conductive structure S1 arranged therebetween may be provided on the same plane. In FIG. 9A, the via conductors 3a, 3b, which are the first conductive structures S1, are provided between the pattern conductors $2g_1$ and the pattern conductors $2g_2$ at a same height h1 from a bottom surface of the stacked composite filter device 100B. Here, the pattern conductor $2g_1$ defines the first capacitor pattern. Further, the pattern conductor $2g_2$ defines the second capacitor pattern.

Further, the first capacitor pattern and the second capacitor pattern with the first conductive structure S1 provided therebetween may be located on different planes. In FIG. 9B, the via conductors 3a, 3b, which are the first conductive structures S1, are provided between the pattern conductor $2f_1$ at a height h2 and the pattern conductor $2e_2$ at a height h3 from the bottom surface of the stacked composite filter device 100B.

Here, the pattern conductor $2f_1$ defines the first capacitor pattern.

Further, in any case where the pattern conductor $2e_2$ defines the second capacitor pattern, the first conductive structure S1 defines a shield structure.

Capacitance between opposing pattern conductors is larger when the opposing pattern conductors are located on different planes than when the opposing pattern conductors are located on the same plane. The number of leaked signals increases in proportion to the capacitance. Therefore, when the first capacitor pattern and the second capacitor pattern are arranged on different planes, the effect of the first conductive structure S1 arranged therebetween as a shield structure is higher.

Here, with the circuitry of the stacked composite filter device 100B shown in FIG. 8, the first filter F1B is a filter including a first high-pass filter and a first low-pass filter.

The first high-pass filter includes a first series capacitor, a first parallel capacitor, and a first parallel inductor. The first series capacitor is connected to a path between the first signal port PO1 (first signal electrode $2u_1$) and the second signal port PO2 (second signal electrode $2u_2$). The first parallel capacitor is connected to a path between a path between the first series capacitor and the second signal port PO2 and the grounding electrode $2u_4$. The first parallel inductor is connected to a path between the first parallel capacitor and the grounding electrode $2u_4$.

For example, a combination of the first capacitor C1, the third capacitor C3, and the first inductor L1 defines the first high-pass filter. Further, a combination of the second capacitor C2, the fourth capacitor C4, and the third inductor L3 may define the first high-pass filter (see FIG. 8).

Here, a case is considered where the first high-pass filter is defined by a combination of the second capacitor C2, the fourth capacitor C4, and the first inductor L1. As described above, the second capacitor C2 is defined by the pattern conductor $2g_1$, the pattern conductor $2i_1$, and the pattern conductor $2k_1$. The fourth capacitor C4 is defined by the pattern conductor $2f_1$ and the pattern conductor $2g_1$. That is, in FIG. 7, the first high-pass filter includes the pattern conductors $2f_1$, $2g_1$, $2i_1$, $2k_1$ and the pattern conductor $2b_1$ defining the first inductor L1.

The second capacitor C2, the fourth capacitor C4, and the fifth capacitor C5, which is defined by the pattern conductor $2g_1$ and the pattern conductor $2i_2$, share the pattern conductor $2g_1$. That is, the pattern conductor $2g_1$ also serves as a connecting conductor among the second capacitor C2, the fourth capacitor C4, and the fifth capacitor C5. Further, the first capacitor C1 that is defined by the pattern conductor $2i_1$ and the pattern conductor $2m_1$ and the second capacitor C2 share the pattern conductor $2i_1$. That is, the pattern conductor $2i_1$ also defines and functions as a connecting conductor between the first capacitor C1 and the second capacitor C2.

The pattern conductor $2i_1$, which is one side electrode of the second capacitor C2, is electrically connected to the first signal electrode $2u_1$ with the pattern conductors $2m_1$, $2p_1$ and a via conductor that is not illustrated interposed therebetween. Further, the pattern conductor $2g_1$, which is the other side electrode of the second capacitor C2 and one side electrode of the fourth capacitor C4, is electrically connected to the second signal electrode $2u_2$ with the pattern conductor $2i_2$ and the via conductor that is not illustrated interposed therebetween. Further, the pattern conductor $2f_1$, which is the other side electrode of the fourth capacitor C4, is electrically connected to the grounding electrode $2u_4$ with a via conductor (including the non-illustrated via conductor) defining the first inductor L1, the via conductors 3a, 3b, and the pattern conductor $2t_3$ interposed therebetween.

Similarly, the second filter F2B can be said as a filter including a second low-pass filter and a second high-pass filter.

With respect to the second high-pass filter, for example, the second high-pass filter may be defined by a combination of the ninth capacitor C9, the tenth capacitor C10, and the second inductor L2 (see FIG. 8) but is not limited thereto, and the following features may be included. A second series capacitor, a second parallel capacitor, and a second parallel inductor are included. The second series capacitor is connected to a path between the first signal port PO1 (first signal electrode $2u_1$) and the third signal port PO3 (third signal electrode $2u_3$). The second parallel capacitor is connected to a path between a path between the second series capacitor and the third signal port PO3 and the grounding electrode $2u_4$. The second parallel inductor is connected to a path between the second parallel capacitor and the grounding electrode $2u_4$.

The second low-pass filter is defined by, for example, the seventh capacitor C7, an inductor connected between the seventh capacitor C7 and GND, the eighth capacitor C8, and an inductor connected in parallel to the eighth capacitor C8.

As described above, the ninth capacitor C9 is defined by the pattern conductor $2g_2$ and the pattern conductor $2j_1$. The tenth capacitor C10 is defined by the pattern conductor $2e_2$ and the pattern conductor $2g_2$. That is, in FIG. 7, the second high-pass filter includes the pattern conductors $2e_2$, $2g_2$, $2j_1$ and via conductors (including non-illustrated one) defining the second inductor L2.

The ninth capacitor C9 and the tenth capacitor C10 share the pattern conductor $2g_2$. That is, it also serves as a connecting conductor between the second capacitor C2, the fourth capacitor C4, and the fifth capacitor C5.

The pattern conductor $2j_1$, which is one side electrode of the ninth capacitor C9, is electrically connected to the first signal electrode $2u_1$ with the pattern conductors $2n_1$, 202 and a via conductor that is not illustrated interposed therebetween. Further, the pattern conductor $2g_2$, which is the other side electrode of the ninth capacitor C9 and one side electrode of the tenth capacitor C10, is electrically connected to the third signal electrode $2u_3$ with a pattern conductor that is not illustrated and a via conductor that is not illustrated interposed therebetween. Further, the pattern conductor $2e_2$, which is the other side electrode of the tenth capacitor C10, is electrically connected to the grounding electrode $2u_4$ with a via conductor (including non-illustrated one) defining the second inductor L2 interposed therebetween.

The first conductive structure S1 is located between at least one of the first capacitor patterns defining the first high-pass filter and at least one of the second capacitor patterns defining the second high-pass filter.

For example, the via conductors 3a, 3b, which are the first conductive structure S1, are arranged between the pattern conductor $2f_1$ of the fourth capacitor C4 and the pattern conductor $2e_2$ of the tenth capacitor C10. The fourth capacitor C4 defines the first high-pass filter as described above. The tenth capacitor C10 defines the second high-pass filter.

If signal leakage occurs from the pattern conductor of the capacitor defining the first high-pass filter to the pattern conductor of the capacitor defining the second high-pass filter, the leaked signal flows directly as it is to the third signal port PO3. Thus, there is a large adverse effect on the filter characteristics. Therefore, by providing the first conductive structure S1 as described above, signal leakage between the first filter F1B and the second filter F2B is able to be significantly reduced or prevented.

First to fourth modification examples of the stacked composite filter device 100B, which is the third preferred embodiment of the present invention, will be described with reference to FIGS. 10 and 11.

Figure 10A:
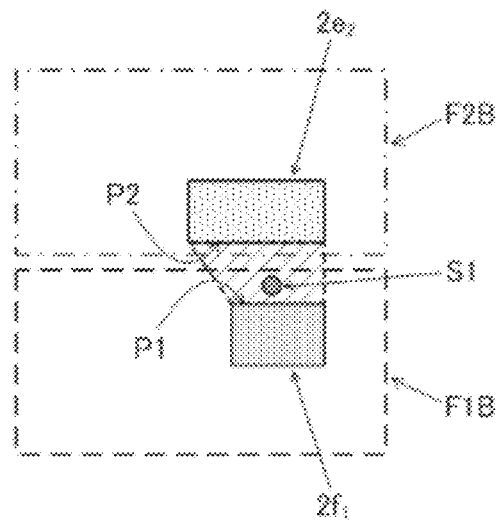
FIGS. 10A to 10C are plan views of first to third modification examples, viewed through in a stacking direction, in which a positional relationship between two pattern conductors is variously changed in the stacked composite filter device.
Figure 10B:
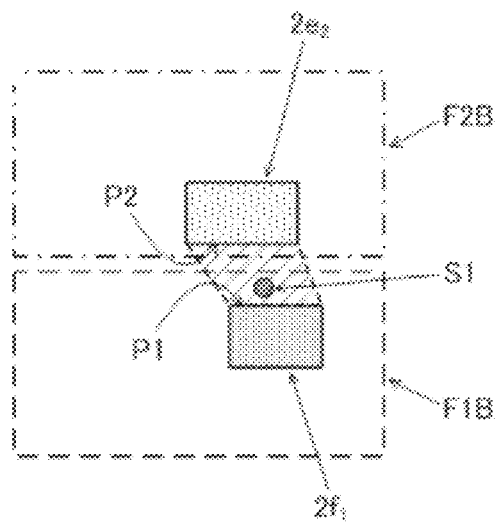
Figure 10C:
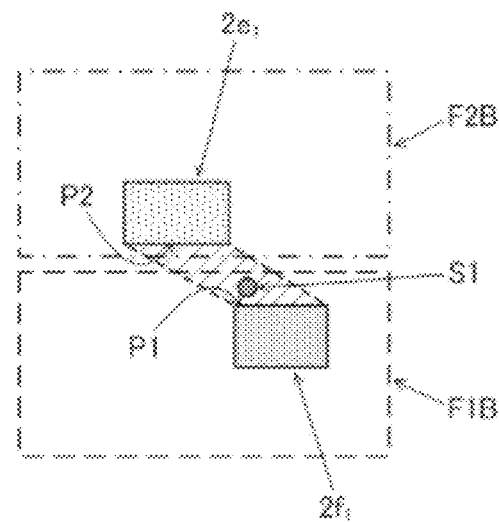
Figure 11:
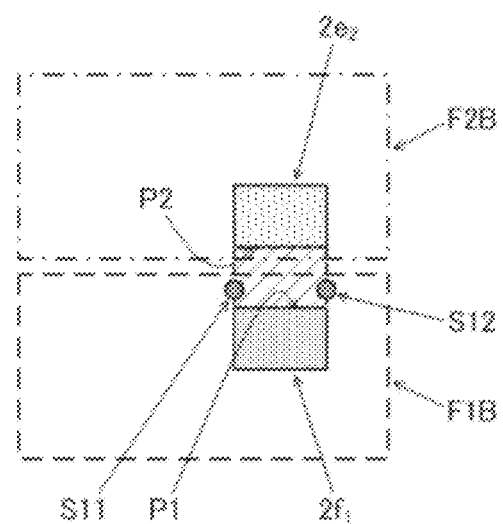
FIG. 11 is a plan view of a fourth modification example, viewed through in the stacking direction, in which a positional relationship between the two pattern conductors and two via conductors defining a first conductive structure when the stacked composite filter device is viewed in the stacking direction is defined.

FIGS. 10A to 10C are transparent plan views when viewing the stacked body from the stacking direction of each dielectric layer, illustrating first to third modification examples in which the positional relationship between the pattern conductors $2f_1$ and the pattern conductors $2e_2$ opposing each other is variously changed in the stacked composite filter device 100B. In the first to third modification examples, it is assumed that the first conductive structure S1 is defined by one via conductor.

Here, an outer edge of the pattern conductor $2f_1$ opposing the pattern conductor $2e_2$ is referred to as a first outer edge, and an outer edge of the pattern conductor $2e_2$ opposing the pattern conductor $2f_1$ is referred to as a second outer edge. A virtual figure is considered that is defined by the first outer edge, the second outer edge, a line segment that virtually connects one end of the first outer edge and one end of the second outer edge, and a line segment that virtually connects the other end of the first outer edge and the other end of the second outer edge. It is assumed that the one end and the other end of each of the outer edges are on the same side. FIG. 9A illustrates a case where the first outer edge and the second outer edge overlap when the first outer edge is projected onto the second outer edge in this virtual figure.

The first modification example illustrated in FIG. 10A illustrates a case where the second outer edge is longer than the first outer edge, and the first outer edge overlaps with the second outer edge when the first outer edge is projected onto the second outer edge in this virtual figure. The same or similar features when the first outer edge is longer than the second outer edge and the second outer edge overlaps with the first outer edge. The second modification example illustrated in FIG. 10B illustrates a case where a part of the first outer edge overlaps with the second outer edge. The third modification example illustrated in FIG. 10C illustrates a case where the first outer edge and the second outer edge do not overlap as lines.

Signal leakage between the first filter F1 and the second filter F2 may occur in this virtual figure region if signal wraparound is ignored. Therefore, in any of the first to third modification examples, the signal leakage between the first filter F1 and the second filter F2 is able to be significantly reduced or prevented because the first conductive structure is provided inside the virtual figure.

In contrast, in the fourth modification example, it is assumed that the first conductive structure S1 is defined by the two via conductors S11 (equivalent to the via conductor 3a in FIG. 7) and S12 (equivalent to the via conductor 3b in FIG. 7). FIG. 11 is a transparent plan view illustrating the fourth modification example in which a positional relationship between the pattern conductor $2f_1$ and the pattern conductor $2e_2$ and the two via conductors S11, S12 as viewed in the stacking direction is defined in the stacked composite filter device 100B.

In the fourth modification example, the via conductor S11 is provided on a line segment that virtually connects one end of the first outer edge and one end of the second outer edge. Further, the via conductor S12 is provided on a line segment that virtually connects the other end of the first outer edge and the other end of the second outer edge.

An electric field generated between the pattern conductor $2f_1$ and the pattern conductor $2e_2$ is affected by an edge effect. That is, the electric field generated between the two becomes stronger on the line segment that virtually connects the one end of the first outer edge and the one end of the second outer edge, and on the line segment that virtually connects the other end of the first outer edge and the other end of the second outer edge. Therefore, by providing the first conductive structure S1 in the portion where the electric field becomes strong, the signal leakage between the first filter F1 and the second filter F2 is able to be significantly reduced or prevented.

The preferred embodiments of the present invention described above are provided as examples, and the present invention is not limited to the above-described preferred embodiments and modification examples. That is, the scope of the present invention is defined by the claims, and is intended to include all modification examples within the meaning and scope equivalent to the claims. Moreover, various applications and modification examples can be added within the above range.

The preferred embodiments of the present invention may be applied to, but are not limited to, a multiplexer which is a branching filter used in a small mobile communication device represented by a smartphone.

Noted that the expression "adjacent" of the present invention is supplemented. For example, when a first conductive structure among structures arranged in a first region is arranged closest to a second region, an area in which the first conductive structure is arranged is referred to as an area adjacent to the second region.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A stacked composite filter device comprising:
    a stacked body including a first region and a second region that are different from each other;
    a first filter including a first inductor and having a first pass band, the first filter being provided in the first region;
    a second filter including a second inductor and having a second pass band on a lower frequency side than the first pass band, the second filter being provided in the second region; and
    a first conductive structure that extends in a stacking direction of the stacked body and includes one end grounded, the first conductive structure being provided in either an area that is in the first region and adjacent to the second region or an area that is in the second region and adjacent to the first region; wherein
    the first conductive structure is provided in the area that is in the first region and adjacent to the second region and another end of the first conductive structure is connected to the first inductor, or the first conductive structure is provided in the area that is in the second region and adjacent to the first region and the other end of the first conductive structure is connected to the second inductor; and
    the first conductive structure is located between the first filter and the second filter in a direction that is orthogonal or substantially orthogonal to the stacking direction.

2. The stacked composite filter device according to claim 1, wherein the first conductive structure is provided in the area that is in the first region and adjacent to the second region.

3. The stacked composite filter device according to claim 2, wherein
    the first filter further includes a third inductor;

a second conductive structure that extends in the stacking direction of the stacked body and has one end grounded is further provided in the area that is in the first region and adjacent to the second region; and another end of the second conductive structure is connected to the third inductor.

4. The stacked composite filter device according to claim 3, wherein a third conductive structure that extends in the stacking direction of the stacked body and has one end grounded is further provided in the area that is in the first region and adjacent to the second region; and the third conductive structure is provided between the first conductive structure and the second conductive structure.

5. The stacked composite filter device according to claim 2, wherein the first filter further includes a third inductor;

a second conductive structure that extends in the stacking direction of the stacked body and has one end grounded is further provided in the area that is in the first region and adjacent to the second region; and another end of the second conductive structure is connected to the second inductor.

6. The stacked composite filter device according to claim 1, wherein at least a portion of the first region that includes at least a portion of the first filter and at least a portion of the second region that includes at least a portion of the second filter are adjacent to one another in the direction that is orthogonal or substantially orthogonal to the stacking direction.

7. The stacked composite filter device according to claim 1, wherein the first conductive structure is a shield structure.

8. The stacked composite filter device according to claim 1, wherein the first conductive structure is defined by a plurality of first via conductors that each extend in the stacking direction of the stacked body and each have one end grounded.

9. The stacked composite filter device according to claim 1, wherein the first conductive structure is defined by a plurality of first via conductors that each extend in the stacking direction of the stacked body and each have one end connected to the first inductor.

10. The stacked composite filter device according to claim 1, wherein the first filter includes a first capacitor and a second capacitor connected in series; and the first conductive structure is connected between ground and a node between the first capacitor and the second capacitor.

11. The stacked composite filter device according to claim 10, wherein the first inductor is connected in series with the first conductive structure.

12. A stacked composite filter device comprising:

a stacked body provided by stacking a plurality of dielectric layers and including at least one each of first and second inductor patterns and at least two each of first and second capacitor patterns each provided between predetermined layers of the plurality of dielectric layers, and at least one first conductive structure penetrating at least one of the plurality of dielectric layers;

first, second, and third signal electrodes located on a bottom surface of the stacked body; and a grounding electrode; wherein a first filter including the first inductor pattern and the first capacitor patterns and having a first pass band is provided between the first signal electrode and the second signal electrode;

a second filter including the second inductor pattern and the second capacitor patterns and having a second pass band on a lower frequency side than the first pass band is provided between the first signal electrode and the third signal electrode;

the first filter and the second filter do not overlap with each other when the stacked body is viewed in a stacking direction of the plurality of dielectric layers; and the first conductive structure includes one end grounded and another end connected to one of the first inductor patterns, and is provided between at least one of the first capacitor patterns and at least one of the second capacitor patterns.

13. The stacked composite filter device according to claim 12, wherein, when the stacked body is viewed from a direction orthogonal or substantially orthogonal to the stacking direction, at least a portion of the first capacitor patterns and at least a portion of the second capacitor patterns are provided on different dielectric layers.

14. The stacked composite filter device according to claim 12, wherein the first filter includes a first high-pass filter including a first series capacitor connected to a path between the first signal electrode and the second signal electrode, a first parallel capacitor connected to a path between a path between the first series capacitor and the second signal electrode and the grounding electrode, and a first parallel inductor connected to a path between the first parallel capacitor and the grounding electrode;

the second filter includes a second high-pass filter including a second series capacitor connected to a path between the first signal electrode and the third signal electrode, a second parallel capacitor connected to a path between a path between the second series capacitor and the third signal electrode and the grounding electrode, and a second parallel inductor connected to a path between the second parallel capacitor and the grounding electrode; and the first conductive structure is provided between at least one of the first capacitor patterns defining the first high-pass filter and at least one of the second capacitor patterns defining the second high-pass filter.

15. A stacked composite filter device comprising:

a stacked body including a plurality of dielectric layers and a plurality of conductor layers that are stacked;

a first filter including a first inductor and a first capacitor;

a second filter including a second inductor and a second capacitor;

a grounding conductor connected to a ground potential; and a conductive structure extending in a stacking direction of the stacked body; wherein the first filter and the second filter are provided in a first region and a second region different from each other, respectively, when viewed in a plan view in the stacking direction;

the conductive structure electrically connects the first inductor to the grounding conductor and is arranged in an area that is in the first region and adjacent to the second region; and the conductive structure is located between the first filter and the second filter in a direction that is orthogonal or substantially orthogonal to the stacking direction.

16. The stacked composite filter device according to claim 15, wherein
the conductive structure further includes a second via conductor that includes one end not connected to the first inductor and another end connected to the grounding conductor.

17. The stacked composite filter device according to claim 15, wherein
the first inductor is defined by a plurality of pattern conductors provided in the plurality of conductor layers and a plurality of via conductors connecting the plurality of pattern conductors;
the conductive structure includes a first via conductor; and
the first via conductor electrically connects a pattern conductor and the grounding conductor, the pattern conductor being provided in a conductor layer farthest in distance from the grounding conductor when viewed in the stacking direction among the plurality of pattern conductors defining the first inductor.

18. The stacked composite filter device according to claim 17, further comprising:
a first capacitor pattern conductor defining the first capacitor; and
a second capacitor pattern conductor defining the second capacitor; wherein
the conductive structure is provided between at least a portion of the first capacitor pattern conductor and at least a portion of the second capacitor pattern conductor.

19. The stacked composite filter device according to claim 18, wherein at least a portion of the first capacitor pattern and at least a portion of the second capacitor pattern are defined by a same capacitor pattern.

20. The stacked composite filter device according to claim 18, wherein, when the stacked body is viewed from a direction orthogonal or substantially orthogonal to the stacking direction, at least a portion of the first capacitor patterns and at least a portion of the second capacitor patterns are provided on a same dielectric layer.

* * * * *